United States Patent [19]

Murotani

[11] Patent Number: 5,034,794
[45] Date of Patent: Jul. 23, 1991

[54] INFRARED IMAGING DEVICE

[75] Inventor: Toshio Murotani, Itami, Japan

[73] Assignee: Mitsbuishi Denki Kabushiki Kaisha, Japan

[21] Appl. No.: 483,653

[22] Filed: Feb. 23, 1990

[30] Foreign Application Priority Data

May 30, 1989 [JP] Japan .................................. 1-38591

[51] Int. Cl.$^5$ ..................... H01L 27/14; H01L 27/12; H01L 27/161
[52] U.S. Cl. ........................................ 357/30; 357/4; 357/16; 357/22; 357/58
[58] Field of Search ..................... 357/16, 30 B, 30 D, 357/30 E, 30 H, 30 I, 30 P, 22 A, 22 MD, 58, 4

[56] References Cited

U.S. PATENT DOCUMENTS 4,782,223 11/1988 Suzuki ............................. 250/214 R
4,894,526 1/1990 Bethea et al. ............................. 357/4
4,922,218 5/1990 Watanabe et al. ..................... 357/16

OTHER PUBLICATIONS

Levine et al., "New 10 μm . . . GaAlAs Superlattices", Appl. Phys. Lett. 50(16), Apr. 1987, pp. 1092-1094.
Levine et al., "High-detectivity . . . Infrared Detector", Appl. Phys. Lett. 53(4), Jul. 1988, pp. 296-298.
Levine et al., "InGaAs/InAlAs . . . 4.4 μm", Appl. Phys. Lett. 52(18), May 1988, pp. 1481-1483.

Primary Examiner—Andrew J. James
Assistant Examiner—Ngan V. Ngo
Attorney, Agent, or Firm—Leydig, Voit & Mayer

[57] ABSTRACT

An infrared imaging device includes an infrared detector element having a pin structure which detects infrared rays 8 to 12 microns in wavelength. The pin structure comprises a multi-quantum well structure as an intrinsic layer including a plurality of $Al_yGa_{1-y}As$ quantum well layers sandwiched by respective $Al_xGa_{1-x}As$ quantum barrier layers (x>y) and a p type $Al_xGa_{1-x}As$ layer and an n type $Al_xGa_{1-x}As$ layer sandwiching the intrinsic layer. An infrared imaging device includes a plurality of picture units, each picture unit including an infrared detector element and a corresponding GaAs FET having a source region connected with the n layer of the infrared detector element on the same substrate. The picture unit and corresponding FET may be monolithically integrated on the same substrate with an n type channel in the substrate interconnecting the picture unit and the corresponding FET.

13 Claims, 8 Drawing Sheets

FIG. I (a)
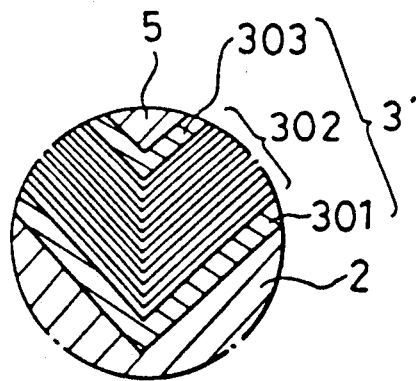
FIG. I (b)
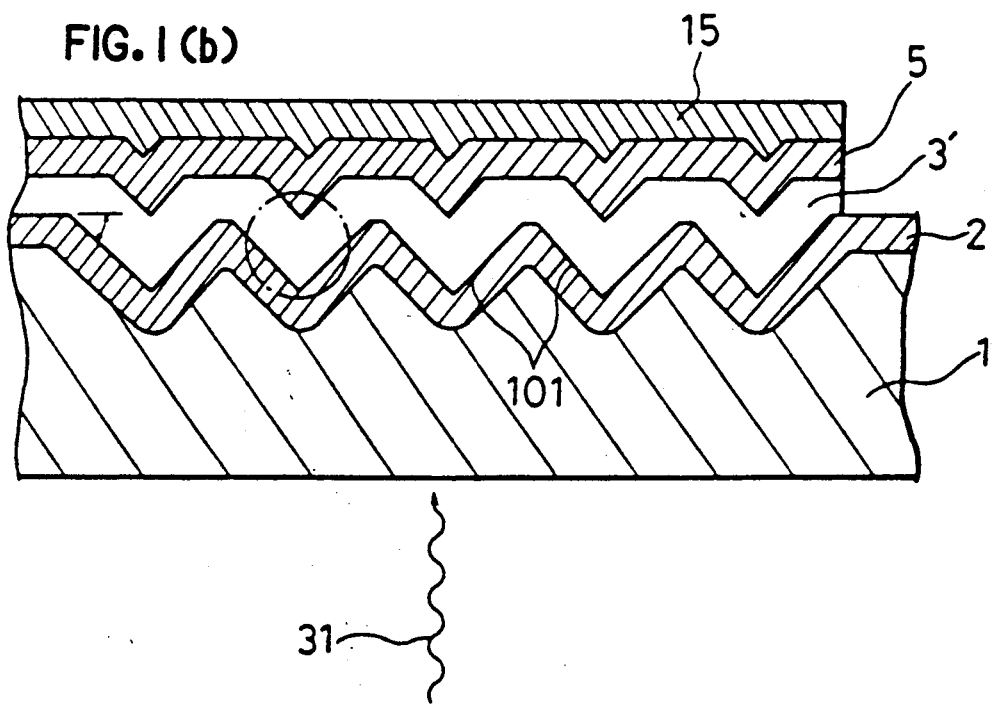

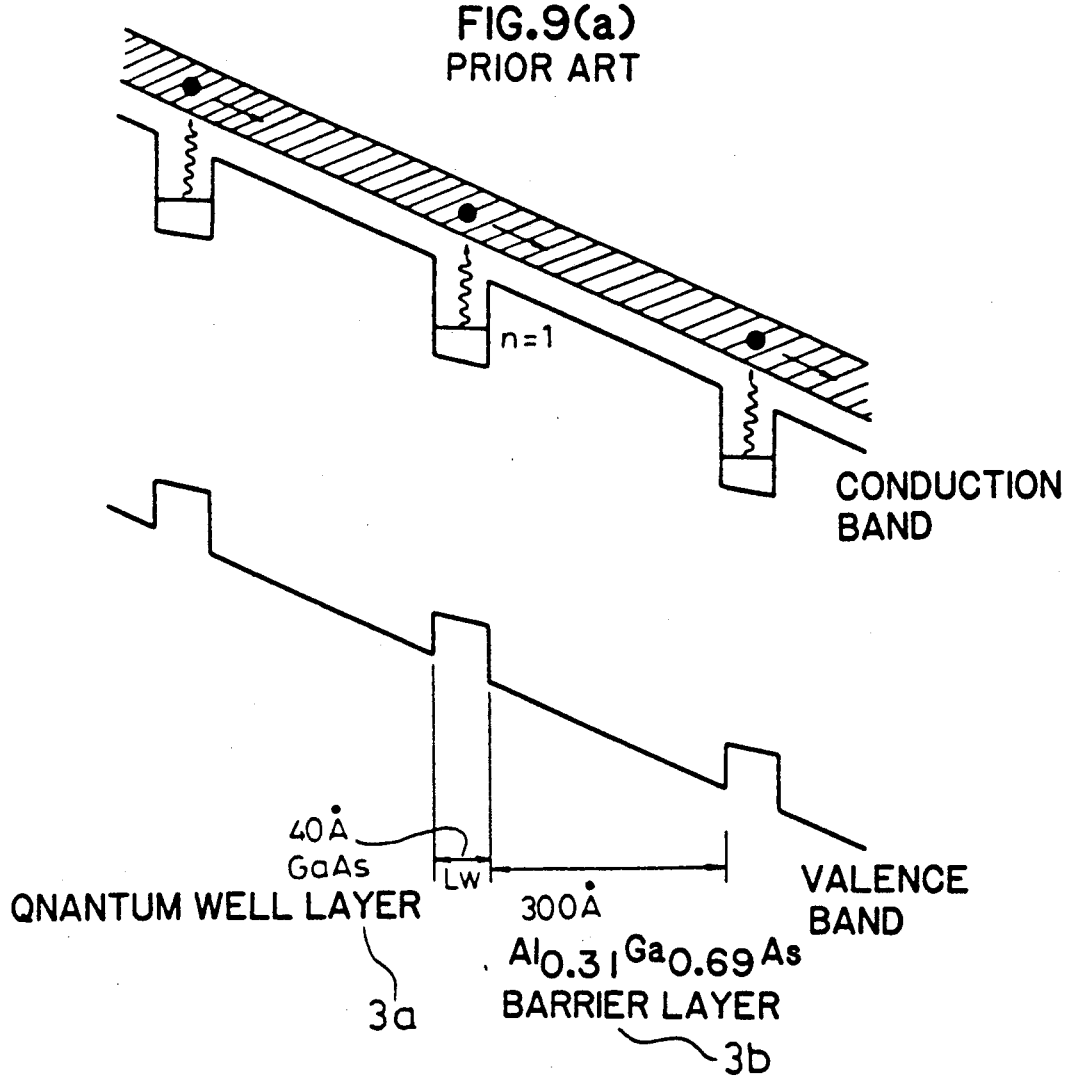

INFRARED IMAGING DEVICE

FIELD OF THE INVENTION

The present invention relates to an infrared imaging device and a production method therefor. More particularly, the invention relates to an infrared detector for detecting infrared rays 8 to 12 microns in wavelength.

BACKGROUND OF THE INVENTION

There is a general relationship between the energy and wavelength of a photon. A semiconductor material having an energy band gap Eg (eV) is sensitive to the light of wavelength $\lambda$ ($\mu$m), $$\lambda = 1.24/E_g.$$

$Hg_{0.8}Cd_{0.2}Te$ has an energy band gap of about 0.1 eV and has been employed as semiconductor material for absorbing infrared rays 8 to 12 microns in wavelength. However, this material vaporizes at about 100° C. because Hg is volatile and has a high vapor pressure. Therefore, handling Hg in thin film and wafer processing is difficult and has been an obstruction to development. This results in such difficulty in production that the number of picture elements in an imaging device is limited.

On the other hand, research on III-IV materials, such as GaAs, is advancing. An infrared detector element having a sensitivity comparable to HgCdTe uses multi-quantum wells (hereinafter referred to as MQW).

FIG. 8 is a cross-sectional view showing an MQW infrared detector element described in *Applied Physics Letters*, Volume 50, Number 16, April 1987, pages 1092-1094. In FIG. 8, reference numeral 1 designates a semi-insulating GaAs substrate. An n+-GaAs contact layer 2 is epitaxially grown on semi-insulating GaAs substrate 1 to a thickness of about 1 micron. Reference numeral 3 designates an Al-GaAs-GaAs MQW structure. This AlGaAs-GaAs MQW structure 3 comprises fifty individual quantum wells, each comprising two $Al_{0.31}Ga_{0.69}As$ barrier layers 3b 300 angstroms thick and a GaAs quantum well layer 3a 40 angstroms thick sandwiched by the barrier layers 3b. The total thickness is 1.73 microns. This MQW structure is produced on the n+ type GaAs layer 2 by MOCVD or MBE. An n+-GaAs contact layer 4 is disposed on the AlGaAs-GaAs MQW structure 3. Reference numerals 12 and 14 designate electrodes. Reference numeral 21 designates an infrared entrance window which is produced by polishing a face of a semi-insulating GaAs substrate at an angle of 45 degrees. Reference numeral 31 designates infrared rays 8 to 12 microns in wavelength. Reference numeral 27 designates an infrared detector element.

In the ground state of n=1, the electron distribution in the quantum wells has a peak at the center of the GaAs quantum well layer 3a. On the other hand, in the excited state of n=2, the electron distribution has a peak in the neighborhood of the interface between the GaAs quantum well structure 3a and the AlGaAs barrier layer 3b, thereby producing a dipole moment perpendicular to the layers due to an optical transition. Of the electric field components present in electromagnetic waves, e.g., infrared rays, only the electric field component parallel to the dipole moment interacts with the dipole moment. However, the electric field of the infrared rays that are incident perpendicular on the MQW structure 3 is shifted perpendicular to the incident direction, that is, parallel to the MQW layer 3. Therefore, the electric field does not interact with the dipole moment and there is no light absorption at the MQW layer 3.

In order to absorb incident light at the MQW layer 3, the infrared rays must be incident on the MQW layer 3 parallel or oblique to the layers. However, in order for the infrared rays to be incident on the MQW layer 3 parallel to the layer, the light has to be incident from the substrate side. This requirement obstructs integration with other elements. In the element of FIG. 8, the face of substrate 1 is polished at an angle of 45 degrees, and the infrared rays 31 are obliquely incident on the MQW layer 3 from the window 21.

While the refractive index of air $n_1$ is 1, the refractive index of semiconductor $n_2$ is quite high, about 4. Therefore, the infrared rays 31 incident on the entrance window 21 in all directions are incident approximately perpendicular to the polished surface due to the refraction of the rays. The infrared rays 31 are incident on the MQW layer 3 at an angle of 45 degrees, and about half of the incident light has an electric field component parallel to the dipole moment of MQW layer 3 whereby about half of the incident light is absorbed.

FIG. 9 shows an energy band diagram of an AlGaAs-GaAs MQW structure 3. Herein, an electric field is applied to the MQW structure 3. Electrons are locally present in the neighborhood of the GaAs quantum well 3a and the energies of electrons are quantized, i.e., the electrons have discrete energies. The quantized energies are obtained from the following formula with reference to the bottom of the GaAs conduction band:

$$E_n = (h^2/2m^*)(n\pi/L_w)^2$$

where n is an integer (n>1), h is Planck's constant, $m^*$ is the effective mass of the electron, and $L_w$ is the thickness of the GaAs quantum well layer 3a.

Herein, n=1 represents the ground state and n=2 represents an excited state. The thickness $L_w$ of the GaAs quantum well layer is selected so that the excited state n=2 is equal to the conduction band level of the AlGaAs layer 3b. The energy $\Delta E$ required for excitation from the state n=1 to n=2 is about 0.1 eV, that is, the optical transition from the state of n=1 to n=2 is caused by the incidence of infrared rays 10 microns in wavelength, and infrared rays corresponding to the optical transition are absorbed. The excited electrons are able to move in the AlGaAs-GaAs MQW structure because of the electric field and contribute to the electrical conductivity. The infrared detector element of FIG. 8 is a photoconducting type, changing conductivity due to infrared ray absorption.

FIG. 10 shows a bias circuit for detecting a change in the resistance of the infrared detector element of FIG. 8. As described above, the infrared detector element 27 is a photoconducting type, and its resistance changes due to the incidence of light. Therefore, the change in the voltage between the terminals 30a and 30b, where a resistor 28 has a high resistance relative to the element 27 and is connected in series with the voltage power supply 29 and a constant current flows, is a measure of the amount of light which is incident on the infrared detector element 27.

In the prior art MQW infrared detector element of such a construction, in order to absorb light, the infrared rays 31 are required to be incident on the infrared entrance window 21 which is produced by polishing the substrate 1 in a diagonal direction. The infrared rays cannot be incident on the main, i.e., front, surface or rear surface of the semiconductor. Therefore, it is quite difficult to integrate a plurality of infrared detector elements. Furthermore, since the prior art infrared detector element is a photoconducting type, a bias circuit is required for detecting incident infrared rays, complicating the circuitry. Therefore, such an infrared detector element is inconvenient.

SUMMARY OF THE INVENTION

It is an object of the present invention to provide a pin photovoltaic infrared imaging device for detecting infrared rays incident on either of the front and rear surfaces of the device that is superior in performance in an imaging circuit.

It is another object of the present invention to provide a method of producing such a device.

Other objects and advantages of the present invention will become apparent from the detailed description given hereinafter. It should be understood, however, that the detailed description and specific embodiments are given by way of illustration only since various changes and modifications within the spirit and scope of the invention will become apparent to those skilled in the art from this detailed description.

According to a first aspect of the present invention, a pin type infrared detector element for detecting infrared rays 8 to 12 microns in wavelength includes an intrinsic multi-quantum well structure in which a plurality of $Al_yGa_{1-y}As$ quantum well layers are sandwiched between a plurality of $Al_xGa_{1-x}As$ layers (x>y) (hereinafter referred to as an AlGaAs-MQW structure), with a p-$Al_xGa_{1-x}As$ layer and an n-$Al_xGa_{1-x}As$ layer sandwiching the intrinsic layer therebetween. With this structure, a plurality of infrared detector elements can be easily integrated into an infrared imaging circuit.

According to a second aspect of the present invention, a pin photodiode having an AlGaAs-MQW structure intrinsic layer which detects the infrared rays 8 to 12 microns in wavelength and a source of a GaAs FET are connected to each other by an n-type ion implantation layer and are integrated with each other, thereby producing an imaging unit of an infrared imaging device. Infrared rays incident on the device from the front surface or the rear surface of the substrate are detected, thereby producing an infrared imaging element with a high integration density.

According to a third aspect of the present invention, a pin photodiode having an AlGaAs-MQW structure intrinsic layer which detects infrared rays 8 to 12 microns in wavelength includes a plurality of facets on a substrate having an angle of 45±15 degrees with respect to the front face of the GaAs substrate. Therefore, infrared rays incident on the front surface or the rear surface of the substrate are detected, thereby producing an infrared imaging element with a high integration density.

According to a fourth aspect of the present invention, a pin photodiode having an AlGaAs-MQW structure intrinsic layer for detecting infrared rays 8 to 12 microns in wavelength includes a plurality of facets on a substrate having an angle of 45±15 degrees with respect to the front face of the GaAs substrate. The pin photodiode is connected to the source region of a GaAs FET by an n-type ion implantation layer, thereby producing an imaging unit of an infrared imaging device, and infrared rays incident on the front surface or the rear surface of the substrate are detected. Therefore, the infrared detector element and the GaAs FET can be monolithically integrated on the semi-insulating GaAs substrate by connecting the n-type layer of the element to the source of an FET, and a scanning circuit comprising the detector element and the GaAs FET can be easily achieved.

According to a fifth aspect of the present invention, a pin photodiode having an AlGaAs-MQW structure intrinsic layer for detecting infrared rays 8 to 12 microns in wavelength is disposed on the front surface of the GaAs substrate and a source of a GaAs FET is connected to the pin photodiode by an n-type ion implantation layer, thereby producing an imaging unit of an infrared imaging device. Furthermore, a plurality of facets having an angle of 45±15 degrees with respect to the surface of the GaAs substrate are produced on the rear surface of the GaAs substrate. Therefore, the detected infrared rays can be obliquely incident on the device from the rear surface, thereby producing an infrared imaging element having a high integration density.

In a method for producing an infrared imaging device according to the present invention, a plurality of grooves extending in the [01$\bar{1}$] direction and having a V-shaped crosssection are etched into the surface of a (100) GaAs substrate, thereby producing a plurality of facets having an angle of 45±15 degrees with respect to the front face of the substrate. Thereafter, a pin structure having an AlGaAs-MQW structure intrinsic layer which detects infrared rays 8 to 12 microns in wavelength is epitaxially grown on the plurality of facets by MBE or MOCVD. A GaAs-MQW structure having parallel facets is produced, and an element for detecting infrared rays incident on the front surface or the rear surface is produced.

BRIEF DESCRIPTION OF THE DRAWINGS

FIGS. 1(a) and 1(b) are cross-sectional views of a photovoltaic type infrared detector element according to a first embodiment of the present invention;

FIG. 9 is an energy band diagram of a prior art infrared detector element; and

DETAILED DESCRIPTION OF THE PREFERRED EMBODIMENTS

Figure 2A:
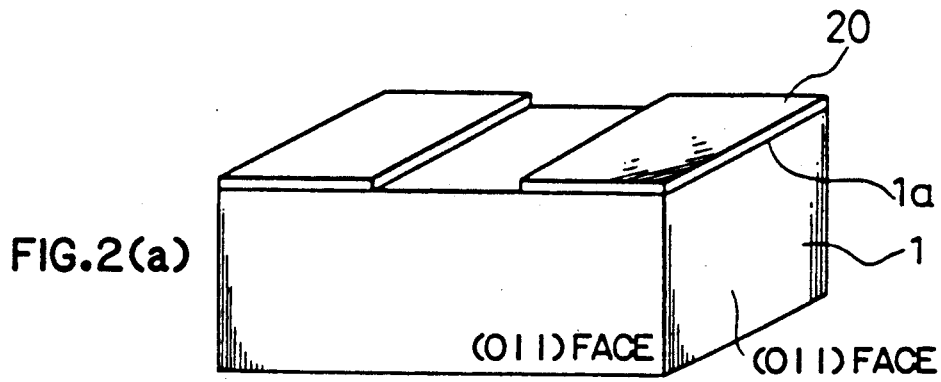
FIGS. 2(a) to 2(d) are diagrams illustrating steps of a process for producing the infrared detector element of FIG. 1.

FIGS. 1(a) and 1(b) are cross-sectional views of an infrared detector portion of an infrared imaging device according to a first embodiment of the present invention. In FIG. 1(b), reference numeral 1 designates a semi-insulating GaAs substrate. A plurality of diagonal faces 101 (hereinafter referred to as facets) having an angle of 45 degrees with respect to the face of substrate 1 are produced on the semi-insulating GaAs substrate 1. An n+ type GaAs layer 2 is produced by ion implanting n type impurities into the GaAs substrate 1 having facets 101. A pin structure 3' including a GaAs-AlGaAs MQW structure is produced on the facets 101 by an epitaxial growth technique, such as MBE or MOCVD. A p+ type GaAs ohmic layer 5 is epitaxially grown on the pin structure portion 2'. A p+ type ohmic electrode 15 is produced on the p+ type GaAs ohmic layer 5. Reference numeral 31 designates infrared rays 8 to 12 microns in wavelength.

FIG. 1(a) shows an enlarged view of the pin structure portion 3' of FIG. 1(b). In FIG. 1(a), reference numeral 302 designates an MQW structure comprising GaAs layers 40 angstroms thick and $Al_{0.3}Ga_{0.7}As$ layers 300 angstroms thick alternately laminated for fifty periods. This MQW structure 302 is disposed between an n type $Al_{0.3}Ga_{0.7}As$ layer 301 and a p type $Al_{0.3}Ga_{0.7}As$ layer 303.

FIGS. 2(a) to 2(d) illustrate steps in a process for producing the infrared detection portion of FIG. 1. In FIGS. 2(a)-2(d), reference numeral 1a designates a (100) face of semiconductor substrate 1. Reference numeral 20 designates a mask comprising $Si_3N_4$.

As shown in FIG. 2(a), $Si_3N_4$ is deposited to about 0.2 microns thickness on the front face 1a of a (100) semi-insulating GaAs substrate 1 by CVD. Thereafter, this $Si_3N_4$ film is photolithographically patterned and plasma etched, thereby producing a mask 20 having a window of 10 microns width in the [01$\bar{1}$] direction.

Figure 2B:
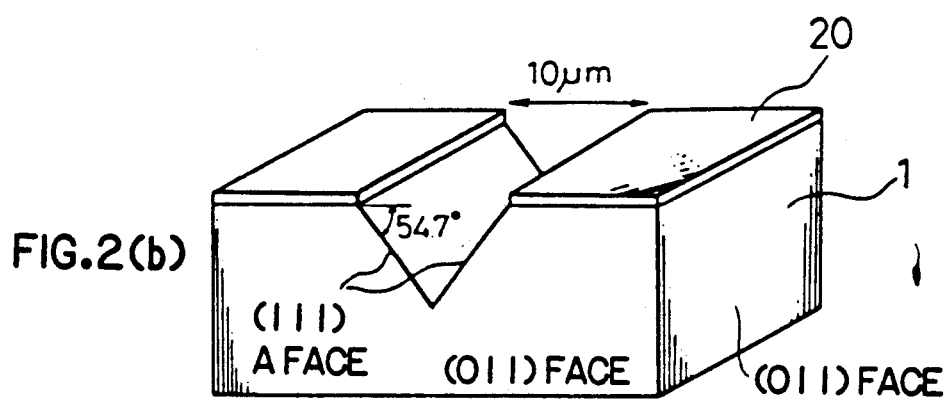

Next, as shown in FIG. 2(b), the GaAs substrate 1 is etched with an etchant of $H_2SO_4:H_2O_2:H_2O$ in a ratio of 5:1:1, thereby producing a V-shaped groove. The side surface of this groove is a [111]A face having an angle of 54.7 degrees with respect to the (100) front face.

Figure 2C:
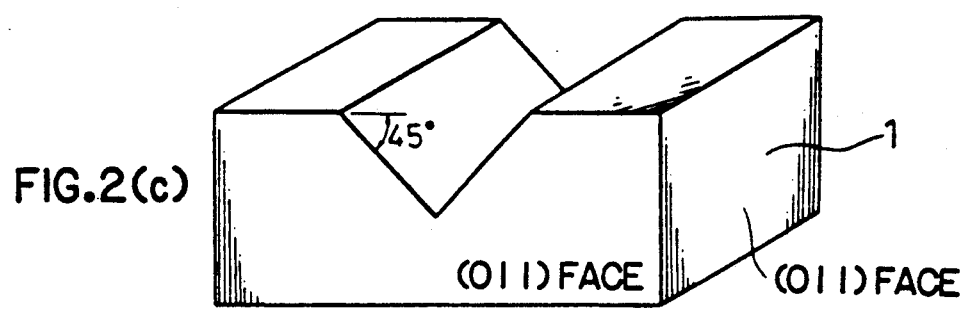

As shown in FIG. 2(c), the remaining $Si_3N_4$ film 20 is removed and the wafer is put in a crystal growth apparatus. The configuration of the groove is transformed by heating before the crystal growth, thereby producing a flat side face having an angle of $45\pm15$ degrees with respect to the (100) face.

Figure 2D:
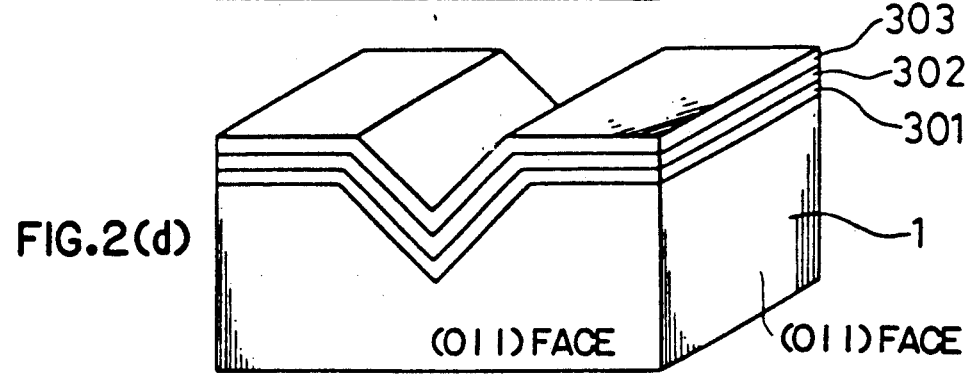

As shown in FIG. 2(d), an n type $Al_{0.3}Ga_{0.7}As$ layer 301, an MQW structure 302 which is produced by alternately depositing $Al_{0.3}Ga_{0.7}As$ layers 300 angstroms thick and GaAs layers 40 angstroms thick for fifty periods, and a p type $Al_{0.3}Ga_{0.7}As$ layer 303 are successively grown by metal organic chemical vapor deposition (MOCVD) using trimethyl gallium (TMG), $AsH_3$, and trimethyl aluminum (TMA1) source and dopant gases at a pressure of 0.1 atmosphere and a temperature of 750° C. so that these three layers are grown at the same speed on the (100) face and on the [111]A face. In this method, even when quite a thin layer is included in the growth layer, such as MQW structure 302, the respective layers are produced with a high degree of parallelism without causing abnormal growth.

Molecular beam epitaxy (MBE) may be used to grow the respective layers. In this case, by setting the growth conditions to $10^{-10}$ Torr, As:Ga=10:1, and a substrate temperature of 600° C., highly parallel growth layers can be obtained.

Figure 3:
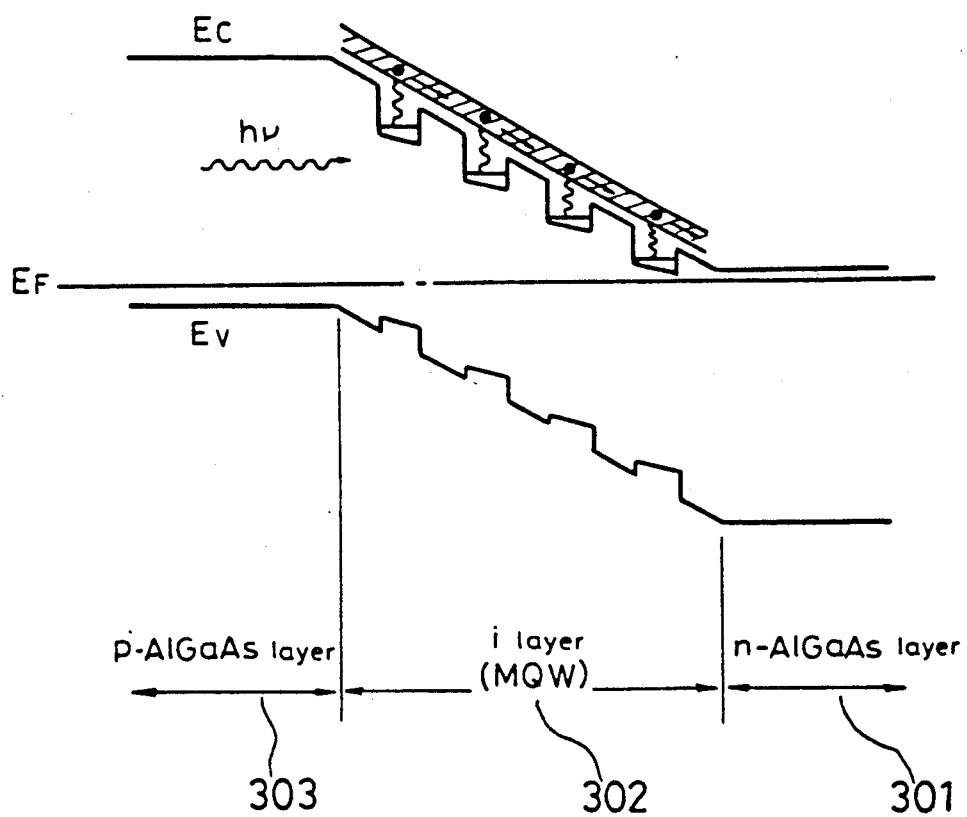
FIG. 3 is an energy band diagram of a pin type photovoltaic element according to the first embodiment of the present invention.

FIG. 3 shows an energy band gap diagram of a pin photovoltaic type infrared detector element according to the present invention. When infrared rays are incident on the device, electrons at the ground state of n=1 in a quantum well optically transit to the excited state of n=2, and the excited electrons move toward the n type AlGaAs layer 301 as a result of an electric field applied to the intrinsic layer comprising MQW structure 302. A photo-induced voltage is generated in the photodiode and photocurrent flows.

As described above, since a pin photodiode is produced with highly parallel layers on facets having an angle of $45\pm15$ degrees with respect to the front face of GaAs substrate 1, infrared rays incident on the front face or on the rear face of the semiconductor are detected. Furthermore, since the infrared detector is a photovoltaic type element, it can be matched with an infrared imaging circuit.

Figure 4:
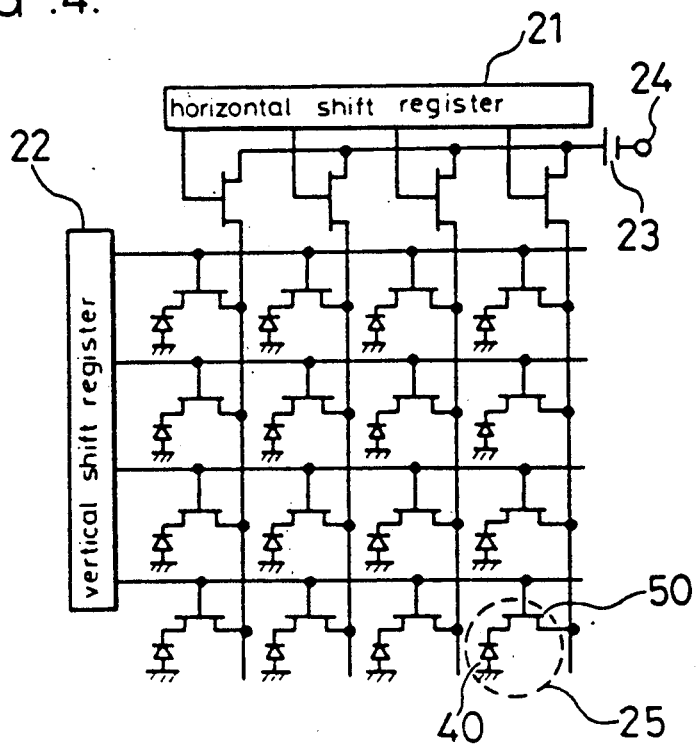
FIG. 4 is a circuit diagram of an infrared imaging device according to the first embodiment of the present invention.

The construction of an infrared imaging device utilizing the above-described pin structure photovoltaic element is shown in FIG. 4. In FIG. 4, reference numeral 21 designates a horizontal direction shift register. Reference numeral 22 designates a vertical direction shift register. Reference numeral 23 designates a battery. Reference numeral 24 designates a signal output terminal. Reference numeral 25 designates a picture element. Reference numeral 40 designates a pin photodiode. Reference numeral 50 designates a GaAs MESFET.

A picture element 25 includes a pin photodiode 40 and a GaAs MESFET 50. Charge carriers generated by incident infrared rays are stored in the pin photodiode 40, and the information of respective picture elements is successively read out utilizing the GaAs MESFET 50 as a switching transistor whereby a picture image of the infrared rays is obtained.

Figure 5:
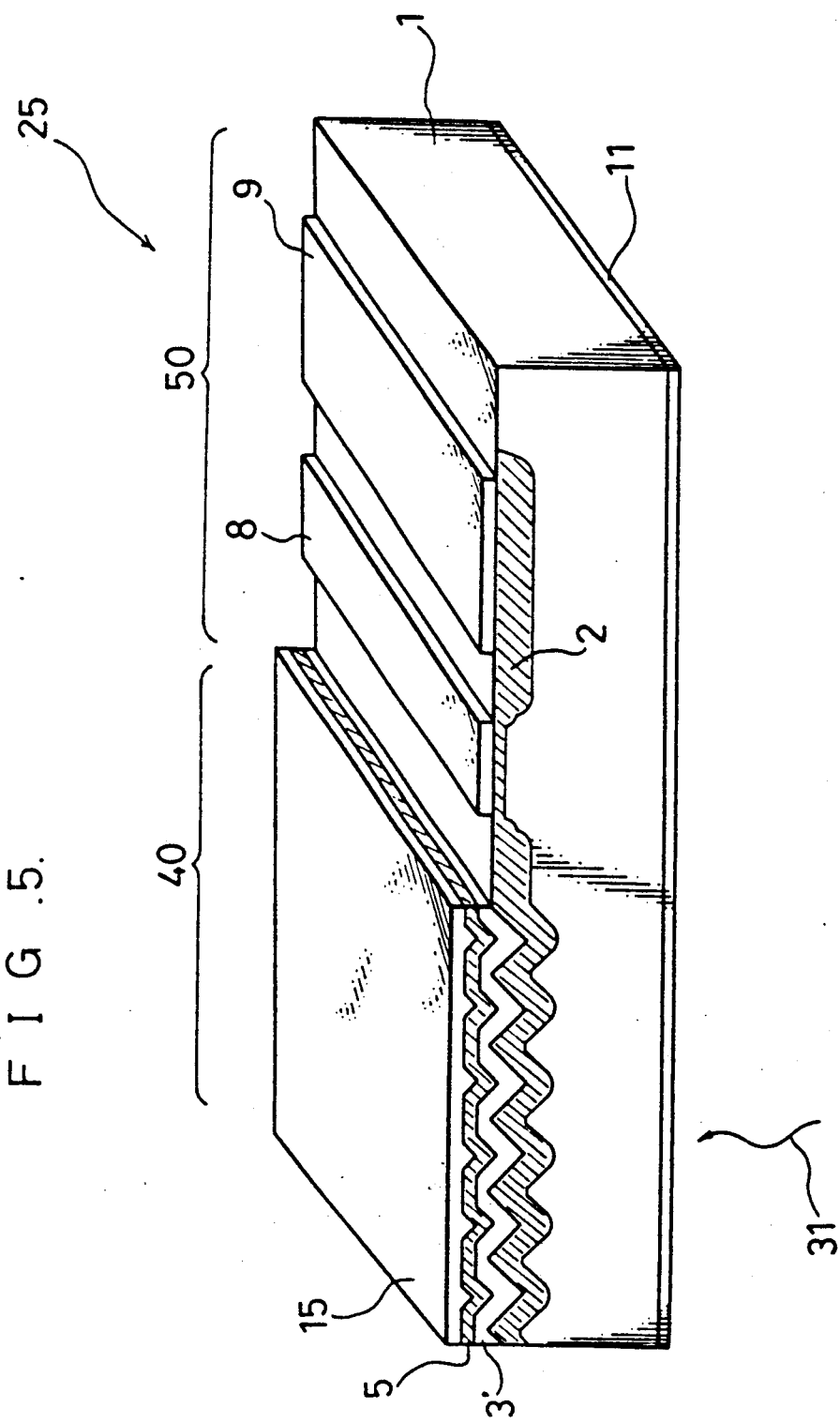
FIG. 5 is a diagram showing a picture element of an infrared imaging device in which a pin photodiode and a GaAs FET are integrated with each other.

FIG. 5 shows the construction of a picture element 25 in which the pin photodiode 40 and the GaAs MESFET 50 are integrated. In FIG. 5, the same reference numerals designate the same elements as shown in FIG. 1. An n type ion implantation layer 2 is disposed at the surface of semi-insulating GaAs substrate 1. A Schottky gate electrode 8 and an ohmic drain electrode 9 are disposed on the substrate 1. An anti-reflection film 11 is disposed on the rear surface of the substrate 1.

Figure 6:
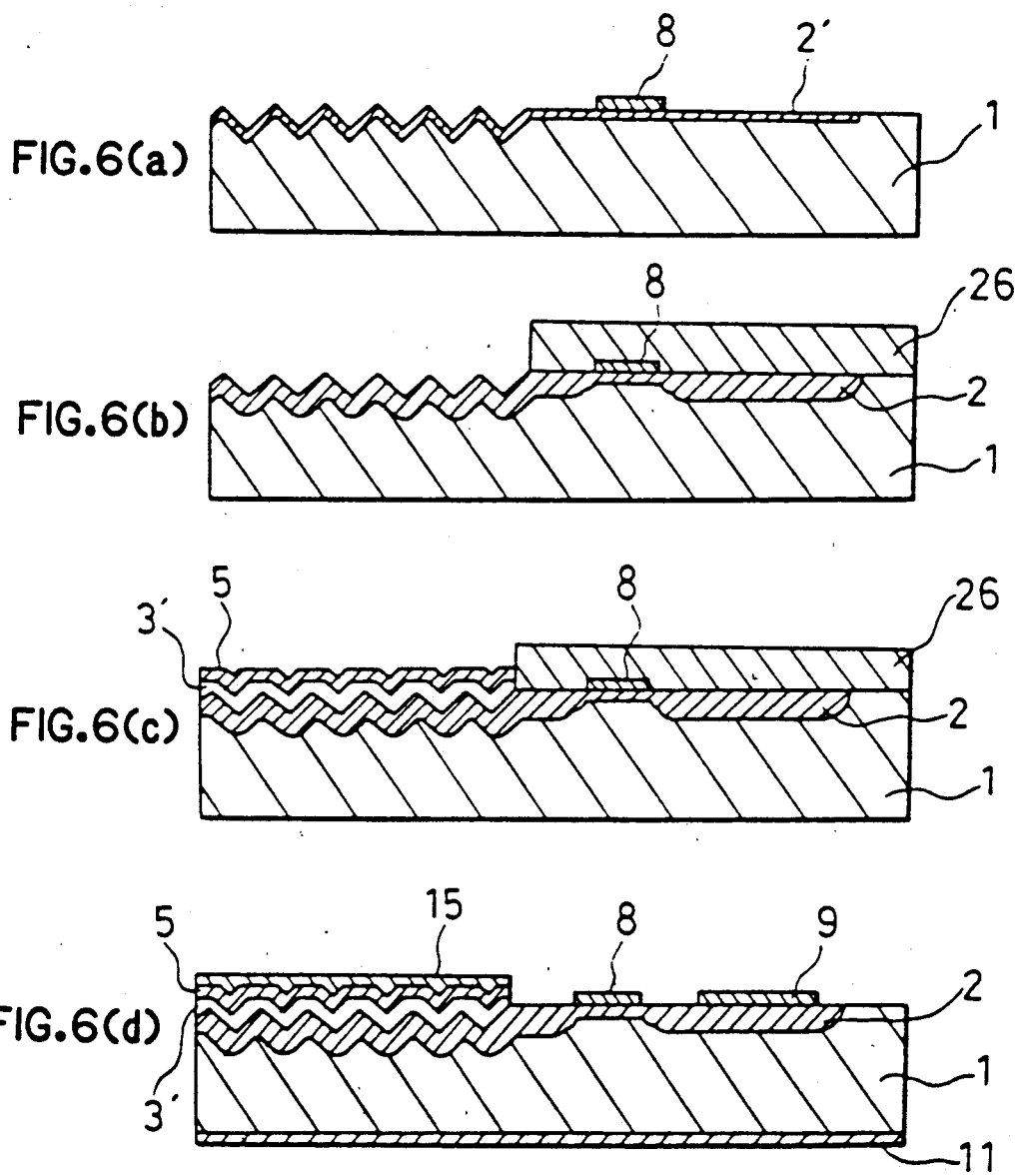
FIGS. 6(a) to 6(d) are diagrams illustrating steps for producing an infrared detector element in which a pin photodiode and a GaAs FET are integrated with each other.

As shown in FIG. 6(a), a V-shaped groove having a [111]A face side surface is produced where a pin photodiode 40 will be produced on the front surface of a (100) semi-insulating GaAs substrate 1 in a 0.5 mm thickness by the method shown in FIGS. 2(c) and 2(b). Thereafter, Si ions are implanted in the entire surface of the substrate, thereby producing an n-type active layer 2' 0.2 microns thick. A refractory metal, such as tungsten silicide, or a metal, such as Al or Au/Mo, is vapor deposited to a thickness of 0.5 microns on a predetermined area where a Schottky junction type gate electrode 8 is to be produced.

Next, side walls comprising an insulating film, such as $SiO_2$, are produced at both sides of the gate electrode 8, and Si ions are implanted into the entire surface of the substrate using the side walls as a mask, thereby producing an ion implantation layer 2. The side walls are removed and an insulating film 26 is deposited on the surface of the substrate except for the pin photodiode portion 40, as shown in FIG. 6(b).

As shown in FIG. 6(c), a pin structure 3' comprising an n-type $Al_{0.3}Ga_{0.7}As$ layer 301, an MQW structure 302 including fifty periods of alternating $Al_{0.3}Ga_{0.7}As$ layers 300 angstroms thick and GaAs layers 40 angstroms thick, and a p+ type GaAs layer 5 are successively grown by MOCVD or MBE, thereby producing the respective layers along the face of substrate 1.

As shown in FIG. 6(d), the insulating film 26 is removed, and a p-type electrode 15 comprising Au/Ti is deposited on the p+ type GaAs layer 5. A drain electrode 9 comprising 5000 angstroms of gold, Au-Ge 100 angstroms thick, and 200 angstroms of nickel is deposited on a predetermined portion on the n-type active layer 2 of GaAs MESFET production portion 50. Thereafter, the metal layers are annealed to produce an ohmic contact electrode. Then, an anti-reflection film 11 comprising ZnSe having a thickness of λ/4n (where n is the refractive index), that is, having minimum reflectance, is deposited on the rear surface of substrate 1.

In such a construction, since the n+ GaAs layer of the pin photodiode 40 is connected to the source of the GaAs MESFET 50 by the n-type ion implantation layer 2, a source electrode is not required.

When a picture element integrated in such a manner is operated in the circuit construction shown in FIG. 4 as an infrared imaging device, the pin photodiode is reverse biased for operation at low temperature. When the electrons of MQW layer 302 are exhausted after use for many hours, no light is absorbed and the pin photovoltaic element does not operate. This problem can be solved by periodically initializing the cell 23 shown in FIG. 4. Cell 23 is connected in a direction reverse to that of usual operation to place the pin photodiode 40 in a forward biased state. Initialization can also be achieved by irradiating the pin photodiode with laser light and by supplying electrons from the valence band to the conduction band.

In the embodiment, a picture element of an infrared imaging device comprises the pin photodiode having an MQW structure 302 as an intrinsic layer produced by selective epitaxial growth on the semi-insulating GaAs substrate 1 and a GaAs FET adjacent thereto. Therefore, an infrared detection element and a driving circuit can be monolithically integrated on the GaAs substrate 1. Thus, the number of picture elements is increased and an infrared imaging device having high resolution is obtained.

Figure 7:
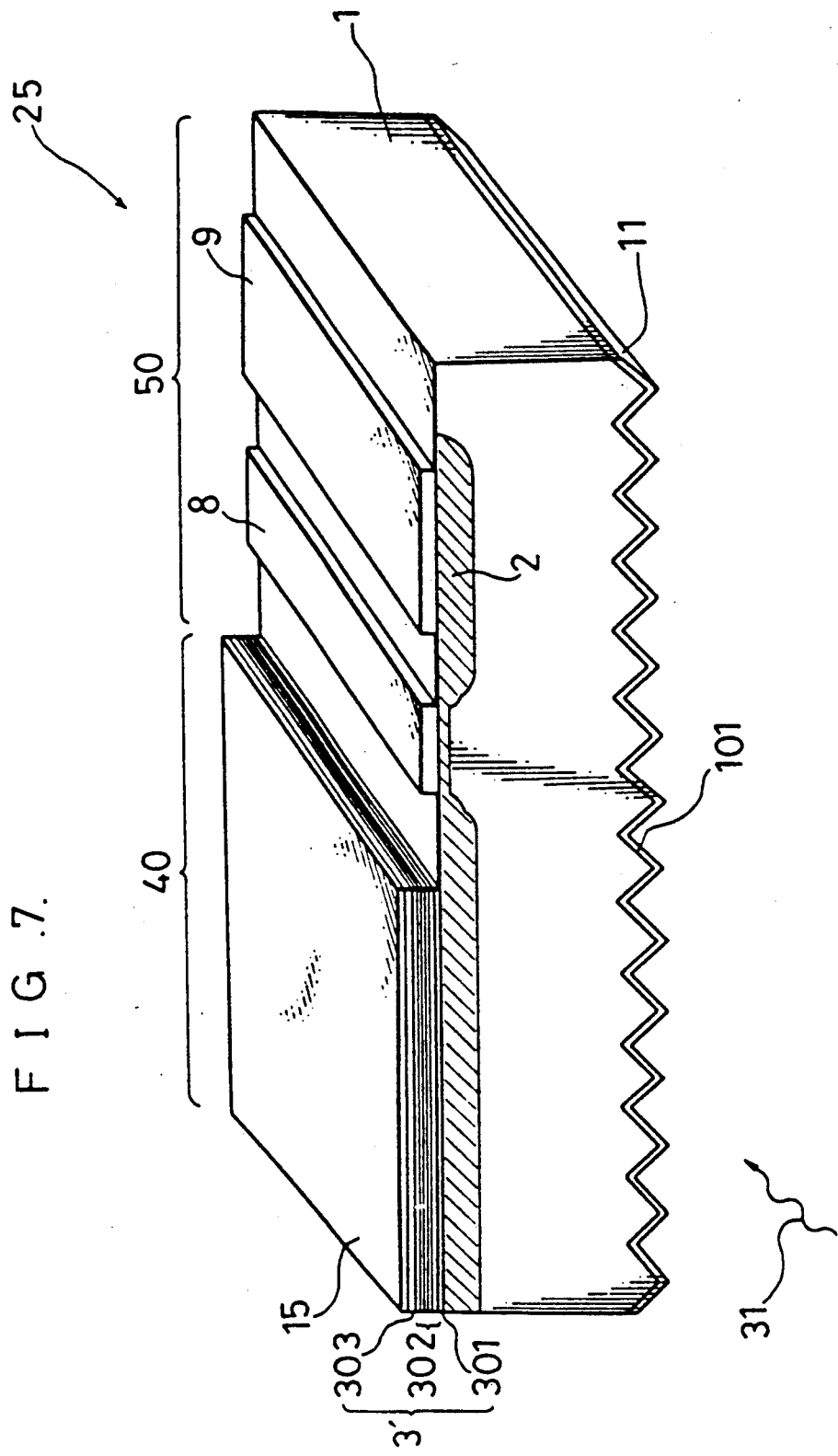
FIG. 7 is a diagram showing a picture element of an infrared imaging device according to a second embodiment of the present invention.
Figure 8:
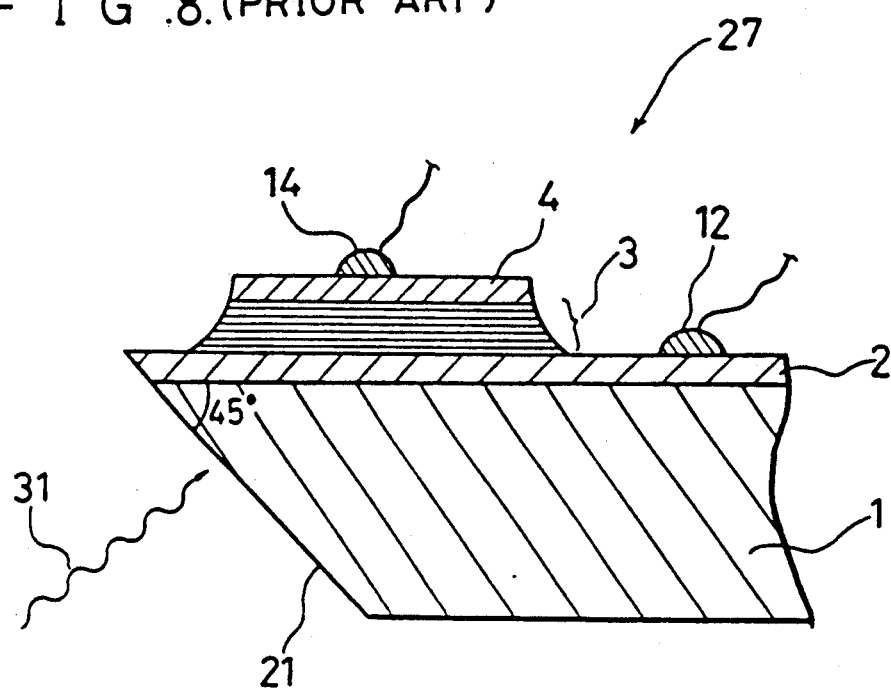
FIG. 8 is a diagram showing a cross-sectional view of a photoconductive type infrared detector using a multilayer quantum well according to the prior art.
Figure 10:
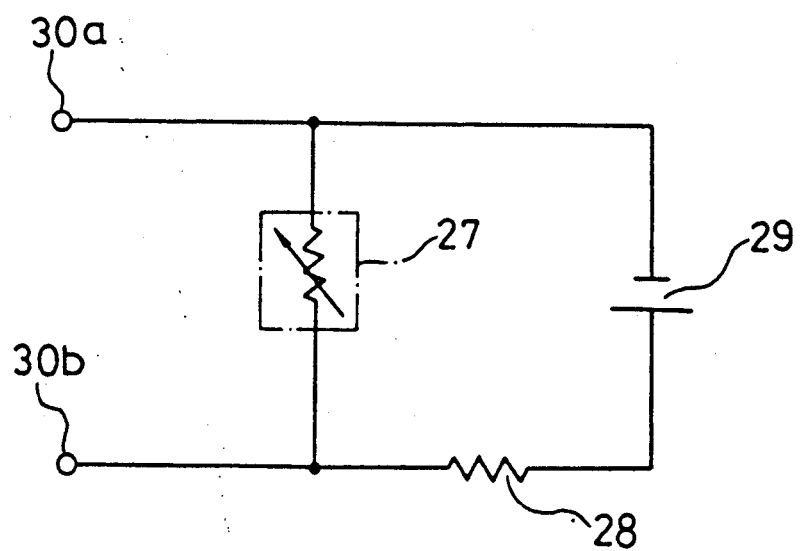
FIG. 10 is a diagram of an imaging circuit of a prior art infrared detector element.

In the above-illustrated embodiment an infrared imaging device in which a pin photodiode 40 is produced on a facet having an angle of 45±15 degrees with respect to the front surface of GaAs substrate 1 is described. Another infrared imaging device, in which a (101) facet having an angle of 45±15 degrees is produced at the rear surface of the substrate and infrared rays 31 are obliquely incident on the substrate, as shown in FIG. 7, is a second embodiment of the present invention. In this device, since the light is incident on the MQW structure 302 at an angle of 45 degrees, similar to the above-described first embodiment, light absorption effectively occurs with the same effects as described above.

While in the above-illustrated embodiment AlGaAs/GaAs materials are used as the III-V group compound semiconductor, other III-V group compound semiconductors, such as InGaAsP/InP materials or InGaAlAs/InP materials, may be used with the same effect as described above.

As is evident from the foregoing description, according to the present invention, a plurality of V-shaped facets having an angle of 45±15 degrees with respect to the surface of a semi-insulating GaAs substrate are produced on the GaAs substrate, and an AlGaAs-MQW structure is produced thereon. Therefore, the infrared rays perpendicular to the device on the front or the rear surface are detected, thereby producing an imaging element with a high integration density.

Furthermore, an AlGaAs-MQW structure may be produced on the front surface of the semi-insulating GaAs substrate and a plurality of facets having an angle of 45±15 degrees with respect to the surface of the substrate are produced on the rear surface of the substrate. Therefore, the infrared rays obliquely incident on the device from the front surface or the rear surface are detected, thereby producing an imaging element having a high integration density.

Furthermore, a pin photodiode having an AlGaAs-MQW structure intrinsic layer and a GaAs FET having a source region connected with the n-type layer of the pin photodiode are produced on a GaAs substrate, thereby constituting a picture element of an infrared imaging device. Therefore, the infrared detector element and the driving circuit can be monolithically integrated on the GaAs substrate whereby an infrared imaging device for detecting infrared rays 8 to 12 microns in wavelength, having a plurality of picture elements, and having a high resolution can be produced at low cost.

Furthermore, according to a production method of an infrared imaging device of the present invention, a plurality of grooves extending in the [01$\bar{1}$] direction and having a V-shaped cross-section are produced on the surface of a (100) GaAs substrate by etching, thereby producing a plurality of facets having an angle of 45±15 degrees with respect to the front surface of the substrate. A pin structure having an AlGaAs-MQW structure intrinsic layer is epitaxially grown on the plurality of facet faces by MBE or MOCVD. Therefore, a highly parallel MQW layer can be precisely produced, and an infrared detector element for detecting infrared rays incident perpendicular to the substrate is produced.

What is claimed is:

1. An infrared imaging element comprising:
   a single crystal semiconductor substrate having opposed front and rear generally planar surfaces, said front surface for receiving incident infrared rays and including a plurality of facets at the front surface disposed at 45±15 degrees to the generally planar front surface;
   an infrared detector element comprising a pin structure disposed on the facets, said pin structure including an intrinsic layer comprising a multi-quantum well structure including a plurality of $Al_yGa_{1-y}As$ quantum well layers respectively sandwiched by $Al_xGa_{1-x}As$ quantum barrier layers (x>y) and a p type $Al_xGa_{1-x}As$ layer and an n type $Al_xGa_{1-x}As$ layer sandwiching said multi-quantum well structure.

2. An infrared detector element as defined in claim 1 wherein said multi-quantum well structure comprises $Al_xGa_{1-x}As$ quantum barrier layers, each about 300 angstroms thick and $Al_yGa_{1-y}As$ quantum well layers, each about 40 angstroms thick.

3. An infrared detector element as defined in claim 1 wherein said x is about 0.3 and y is about 0.

4. An infrared imaging device as defined in claim 1 wherein said substrate is a III-V compound semiconductor of [100] orientation and said facets extend in the [01$\bar{1}$] direction and the facet surfaces are [111]A faces.

5. An infrared imaging device comprising:
a plurality of picture units, each picture unit including an infrared detector element having a pin structure and disposed on a semi-insulating single crystal GaAs substrate having a main surface on which infrared rays are incident, the picture unit being disposed on a plurality of facets in the substrate and forming an angle of 45±15 degrees with respect to the main face of said substrate, and a GaAs FET having a source region connected with the n layer of a corresponding infrared detection element on said substrate, said pin structure including an intrinsic layer comprising a multi-quantum well structure including a plurality of $Al_yGa_{1-y}As$ quantum well layers sandwiched by respective $Al_xGa_{1-x}As$ quantum barrier layers (x>y) and a p type $Al_xGa_{1-x}As$ layer and an n type $Al_xGa_{1-x}As$ layer sandwiching said multi-quantum well structure.

6. An infrared imaging device as defined in claim 5 wherein said multi-quantum well structure comprises $Al_xGa_{1-x}As$ quantum barrier layers, each about 300 angstroms thick and $Al_yGa_{1-y}As$ quantum well layers, each about 40 angstroms thick.

7. An infrared imaging device as defined in claim 5 wherein x is about 0.3 and y is about 0.

8. An infrared imaging device as defined in claim 5 wherein said substrate has a [100] orientation and said facets have V-shaped cross-sections extending in the [01$\bar{1}$] direction and forming an angle of 45±15 degrees with respect to the (100) main face of said substrate, and the facets of said V-shaped cross-sections are [111]A faces.

9. An infrared imaging device comprising:
a plurality of picture units, each picture unit including an infrared detector element having a pin structure and disposed on a semi-insulating single crystal GaAs substrate having a main surface and an opposed rear surface and a GaAs FET having source region electrically connected to the n layer of said infrared detector element on said substrate, said pin structure including an intrinsic layer comprising a multi-quantum well structure including a plurality of $Al_yGa_{1-y}As$ quantum well layers sandwiched by respective $Al_xGa_{1-x}As$ quantum barrier layers (x>y) and a p type $Al_xGa_{1-x}As$ layer and an n type $Al_xGa_{1-x}As$ layer sandwiching said multi-quantum well structure, said substrate including a plurality of facets having an angle of 45±15 degrees with respect to the main surface of said substrate and disposed on the rear surface of said substrate on which infrared rays are incident.

10. An infrared imaging device as defined in claim 9 wherein said multi-quantum well structure comprises $Al_xGa_{1-x}As$ quantum barrier layers, each about 300 angstroms thick and $Al_yGa_{1-y}As$ quantum well layers, each about 40 angstroms thick.

11. An infrared detector element as defined in claim 9 wherein said x is about 0.3 and y is about 0.

12. An infrared imaging device as defined in claim 5 wherein each picture unit and the corresponding FET are formed on the GaAs substrate and including an n type layer disposed in said substrate at the main surface extending from said source region to the n type $Al_xGa_{1-x}As$ layer.

13. An infrared imaging device as defined in claim 9 wherein each picture unit and the corresponding FET are formed on the GaAs substrate and including an n type layer disposed in said substrate at the main surface extending from said source region to the n type $Al_xGa_{1-x}As$ layer.

* * * * *